United States Patent

[19] Haji

[11] Patent Number: 6,093,904
[45] Date of Patent: Jul. 25, 2000

[54] APPARATUS AND METHOD FOR SURFACE TREATMENT, AND APPARATUS AND METHOD FOR WIRE BONDING USING THE SURFACE TREATMENT APPARATUS

[75] Inventor: Hiroshi Haji, Chikushino, Japan

[73] Assignee: Matsuhita Electric Industrial Co., Ltd., Osaka, Japan

[21] Appl. No.: 09/115,759

[22] Filed: Jul. 15, 1998

Related U.S. Application Data

[62] Division of application No. 08/680,523, Jul. 9, 1996, Pat. No. 5,823,416.

[30] Foreign Application Priority Data

| Jul. 28, 1995 | [JP] | Japan | 7-193062 |
| Aug. 24, 1995 | [JP] | Japan | 7-215860 |
| Aug. 24, 1995 | [JP] | Japan | 7-215862 |
| Aug. 24, 1995 | [JP] | Japan | 7-215864 |
| Aug. 25, 1995 | [JP] | Japan | 7-217251 |
| Sep. 20, 1995 | [JP] | Japan | 7-241148 |

[51] Int. Cl.[7] .................................................. B23K 10/00
[52] U.S. Cl. .............................. 219/121.45; 219/121.43; 219/121.36; 219/121.4; 228/180.5; 228/205
[58] Field of Search ........................... 219/121.43, 121.4, 219/121.44, 121.52, 121.36, 121.45; 228/180.22, 124, 180.5, 220, 221, 205; 156/345; 118/723

[56] References Cited

U.S. PATENT DOCUMENTS

| 4,840,702 | 6/1989 | Schumacher, III . | |
| 4,861,563 | 8/1989 | Shekerjian et al. | 422/186.05 |
| 4,908,095 | 3/1990 | Kagatsume et al. . | |
| 4,921,157 | 5/1990 | Dishon et al. | 228/124 |
| 5,225,651 | 7/1993 | De Gelis et al. | 219/121.43 |
| 5,345,054 | 9/1994 | Frei et al. | 219/121.59 |
| 5,433,371 | 7/1995 | Morisako . | |
| 5,735,451 | 4/1998 | Mori et al. | 228/206 |
| 5,831,238 | 11/1998 | Takuya et al. | 219/121.59 |

FOREIGN PATENT DOCUMENTS 7-106363A  4/1995  Japan .

OTHER PUBLICATIONS

"Surface Treatment for Tungsten to Facilitate Wire Bonding," *IBM Tech. Discl. Bull.*, vol. 33, No. 2, Jul. 1990, p. 89.

*Primary Examiner*—Mark Paschall
*Attorney, Agent, or Firm*—Stevens, Davis, Miller, & Mosher, L.L.P.

[57] ABSTRACT

There are disclosed a surface treatment apparatus and a wire bonding apparatus which are compact in size, have a high processing ability, are simple in construction, and achieve a low cost The surface treatment apparatus includes a base having a transfer path for transferring an object, a lid provided above the base for movement into and out of contact with an upper surface of the base, the lid contacting the base to form a sealed space on the upper surface of the base, an engagement and disengagement mechanism for moving the lid into and out of contact with the base, a transfer mechanism for feeding the object, disposed on the transfer path, into and out of a position beneath the lid when the lid is out of contact with the base, and a treatment portion for surface treating electrodes of the object disposed in the sealed space A wire bonding mechanism is provided at a downstream portion of the transfer path.

14 Claims, 15 Drawing Sheets

APPARATUS AND METHOD FOR SURFACE TREATMENT, AND APPARATUS AND METHOD FOR WIRE BONDING USING THE SURFACE TREATMENT APPARATUS

This Application is a division of Ser. No. 08/680,523 filed Jul. 9, 1996, now U.S. Pat. No. 5,823,416.

BACKGROUND OF THE INVENTION

This invention relates to a surface treatment apparatus for effecting a surface treatment of electrodes of an object such as a board and an electronic part, and also relates to a wire bonding apparatus for bonding an electrically-conductive wire to the electrode of the board surface treated by this surface treatment apparatus.

In view of the trend toward the small-size design of electronic equipment, attention has been directed to techniques mounting electronic parts on a board, having a circuit pattern, at a high density. In one such technique, a bare semiconductor chip is mounted or placed directly on the board, and then this semiconductor chip is electrically connected to electrodes of the board by thin, electrically-conductive wires (having a diameter of about 25 $\mu$m). The semiconductor chip and the wires are then coated with a resin for sealing purposes.

In many cases, the wire used for this purpose is made of gold, and in view of the bonding with the gold wire, the electrodes of the board are plated with gold. The circuit pattern is usually made of copper, and since gold is not bonded directly to this copper, one or more layers of metal (called a barrier metal layer) are formed on the copper electrodes, and then the surface of this layer is plated with gold. Nickel is most frequently used as the barrier metal.

The thickness of the gold plating film has heretofore been thought to have a great influence on the bonding strength of the wire, and it has been believed that unless the gold plating film is as thick as about 0.3 $\mu$m, the wire can not be bonded satisfactorily.

There are known an electroplating method and a reduction electroless plating method which are capable of forming a thick gold plating film. A problem associated with both methods, however, is that the cost is high since a plating process must be effected for a long period of time.

Therefore, the inventor of the present invention has previously earlier filed an application for a method in which a wire can be bonded with sufficient strength even if the thickness of a plating film is small (Japanese Patent Unexamined Publication No. 7-106363). Since in this technique, the wire can be bonded to a gold plating film having a thickness of as little as 0.05 $\mu$m, the cost for the gold plating can be greatly reduced.

In this technique, (1) a nickel compound is removed from the surfaces of electrodes of a board by a surface treatment apparatus, and then (2) wires are bonded respectively to the electrodes by a wire bonding apparatus.

These steps are required to be carried out with a high efficiency so that the above cost reduction effect will not be affected. However, at present, there is no facility to achieve this requirement. Particularly, there exists no surface treatment apparatus which is compact in size, and which thus can be incorporated in a production line, therefore preventing the new process from extensive use. Therefore, the present invention has been made to provide the optimum system for this new process.

SUMMARY OF THE INVENTION

It is an object of this invention to provide a surface treatment apparatus which is compact in size, has a high processing ability, is simple in construction, and effects the temperature at a low cost.

Another object of the present invention is to provide a wire bonding apparatus which is integrated with a surface treatment apparatus, is compact in size, has a high processing ability, is simple in construction, and effects the bonding at a low cost.

According to one aspect of the present invention, there is provided a surface treatment apparatus comprising:

a base having a transfer path for transferring an object;

a lid provided above the base for movement into and out of contact with an upper surface of the base, the lid contacting the base to form a sealed space for receiving the object on the upper surface of the base;

an engagement and disengagement mechanism for moving the lid into and out of contact with the base;

a transfer mechanism for feeding the object, disposed on the transfer path, into and out of a position beneath the lid when the lid is out of contact with the base; and treatment means for surface treating electrodes of the object disposed in the sealed space.

According to another aspect of the invention, there is provided a wire bonding apparatus comprising:

a base having a transfer path for transferring an object;

a surface treatment apparatus provided along the transfer path;

a wire bonding mechanism juxtaposed with the surface treatment apparatus along the transfer path, the wire bonding mechanism bonding wires to electrodes of the surface treated object;

the surface treatment apparatus comprising a lid movable into and out of contact with an upper surface of the base, the lid contacting the base to form a sealed space for receiving the object, disposed on the transfer path on the upper surface of the base, an engagement and disengagement mechanism for moving the lid into and out of contact with the base, and treatment means for surface treating the electrodes of the object disposed in the sealed space; and a transfer mechanism for transferring the surface treated object from the surface treatment apparatus to a position in front of the wire bonding mechanism.

DESCRIPTION OF THE PREFERRED EMBODIMENTS

A preferred embodiment of the present invention will now be described with reference to the drawings.

Figure 1:
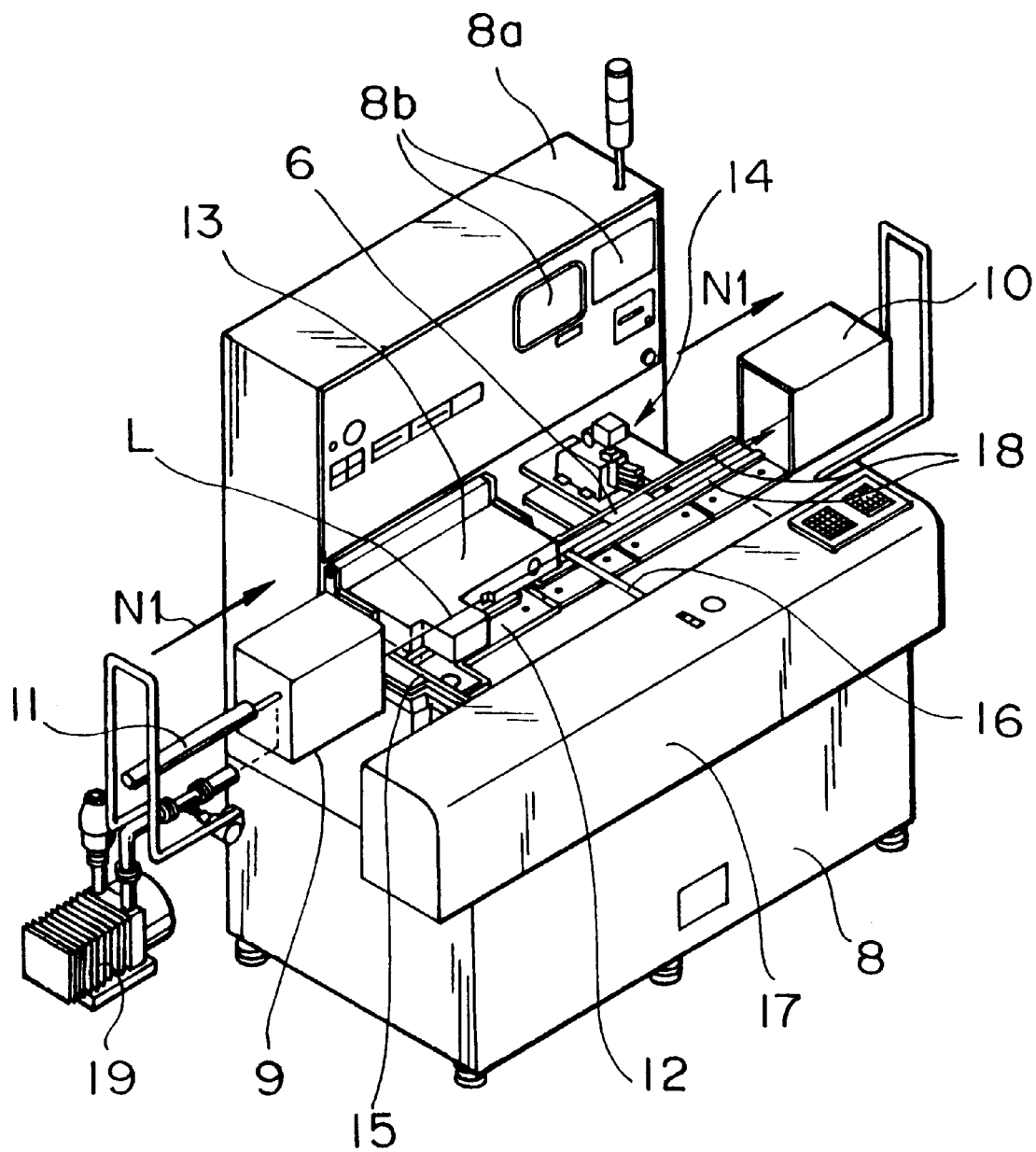
FIG. 1 is a perspective view showing an overall construction of an embodiment of a wire bonding apparatus of the present invention.

FIG. 1 is a perspective view showing an overall construction of one preferred embodiment of a wire bonding apparatus of the present invention.

In FIG. 1, a base mount 8 has a substantially horizontal upper surface, and an upstanding portion 8a extends upwardly from a rear side portion of the base mount 8. A monitor 8b is mounted on a front surface of the upstanding portion 8a, and the operator dan monitor the operating condition of a surface treatment apparatus through the monitor 8b.

A base 12 is mounted on the upper surface of the base mount 8, and a transfer path L extends straight obliquely from the left to the right in FIG. 1 over an upper surface of the base 12. A supply magazine 9 is provided at an upstream side of the transfer path L, and holds or stores boards 6 which are to be surface treated in a stacked manner. A stock magazine 10 is provided at a downstream side of the transfer path L, and receives the surface treated boards 6. In this embodiment, electrodes, plated with gold by a substitution electroless plating method, are formed on the surface of the board 6.

A push cylinder 11 pushes or feeds the board 6 to be surface treated from the supply magazine 9 into the transfer path L.

A lid 13, having a recess at its lower side, is supported above the base 12, and is movable into and out of contact with the base 12.

The base 12 and the lid are structured such that when the lid 13 contacts the base 12 having the transfer path L, the recess in the lid 13 defines a sealed space on the transfer path L, as will be more fully described later. More specifically, the base 12 and the lid 13 cooperate with each other to form this sealed space.

A wire bonding mechanism 14 is provided between the base 12 and the stock magazine 10, and is offset from the transfer path L toward the rear side of the apparatus. The wire bonding mechanism 14 clamps the surface treated board 6 fed along the transfer path L from the upstream side, and electrically connects the electrodes of this board 6 to a semiconductor chip (not shown) by wires.

In this embodiment, within the sealed space defined by the lid 13 and the base 12, plasma cleaning (which is one example of a surface treatment) is applied to the board 6 to remove deposited matter or a nickel compound from the gold-plated electrodes and other parts of the board 6, so that the wires can be easily bonded to these electrodes. Then, in the adjoining wire bonding mechanism 14, the wires are bonded to the board subjected to the plasma cleaning, and subsequently the board 6 is stored in the stock magazine 10.

A first arm 15 has a distal end portion extending to the transfer path L, and a second arm 16 is disposed downstream of the first arm 15, and is spaced a predetermined distance from the first arm 15 along the transfer path L, the second arm 16 being parallel to the first arm 15.

An elongate cover 17 is provided on the front side portion of the upper surface of the mount base 8, and extends parallel to the transfer path L. Mounted within the cover 17 is an arm moving mechanism (more fully described later) for moving the first and second arms 15 and 16 parallel to the transfer path L while keeping the first and second arms 15 and 16 in a condition such that the arms 15 and 16 are parallel and are spaced at the predetermined distance from each other. The board on the transfer path L is transferred by the first and second arms 15 and 16.

A pair of guides 18 are mounted on the base 12 to form the transfer path L, and guide the board 6 from a position, disposed in front of the wire bonding mechanism 14, to the stock magazine 10.

An engagement and disengagement mechanism for moving the lid 13 upward and downward and for moving the lid 13 between a horizontal condition and a vertical condition will be described with reference to FIGS. 2 to 5.

Figure 2:
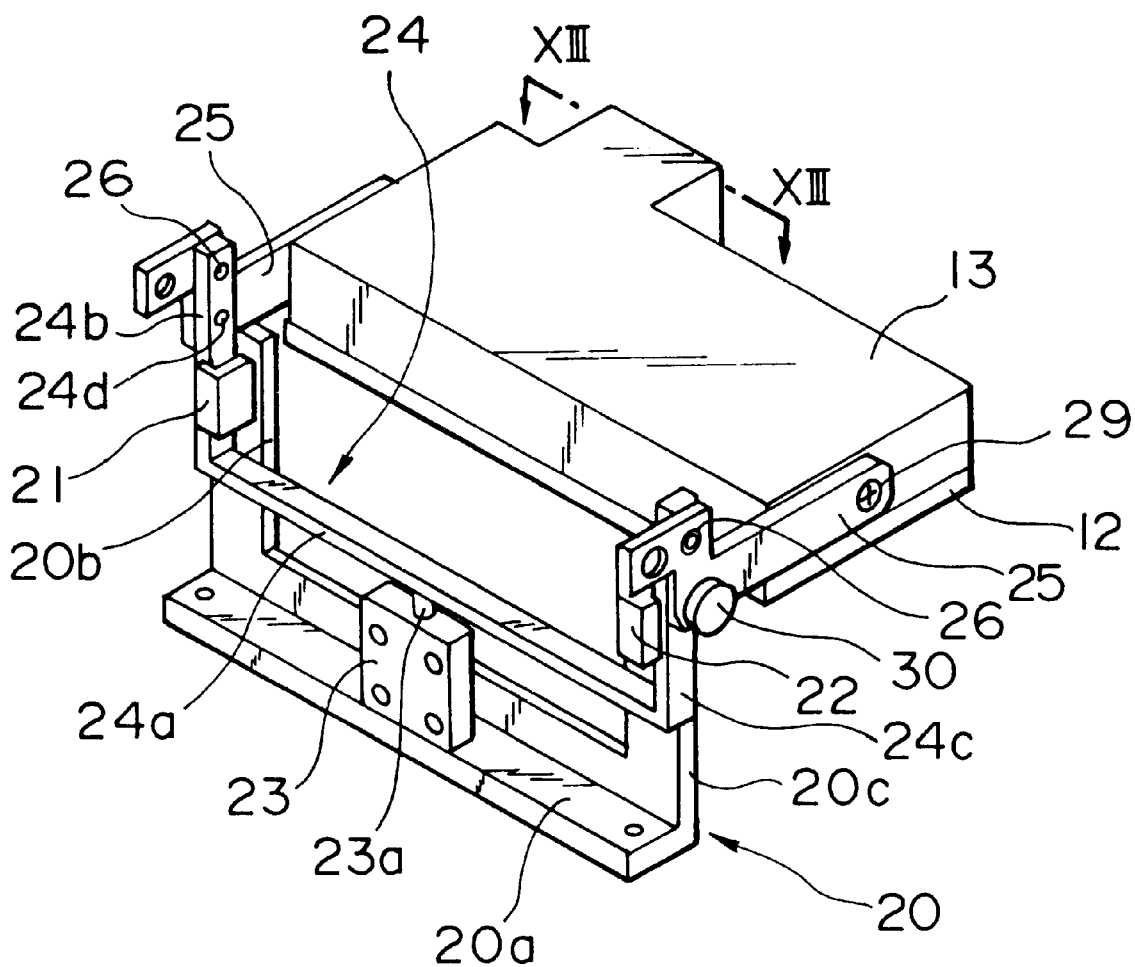
FIGS. 2 and 3 are perspective views of engagement and disengagement means in the embodiment of the present invention.
Figure 3:
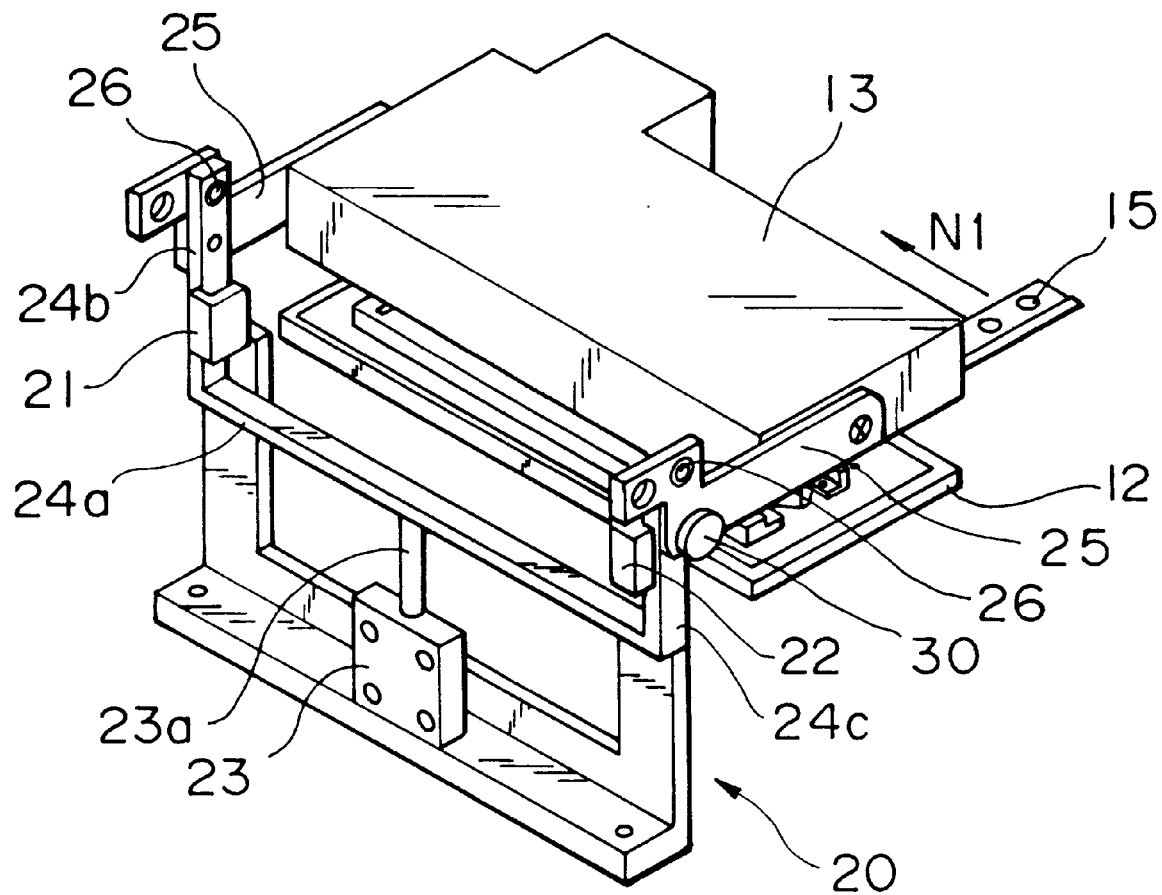
Figure 5:
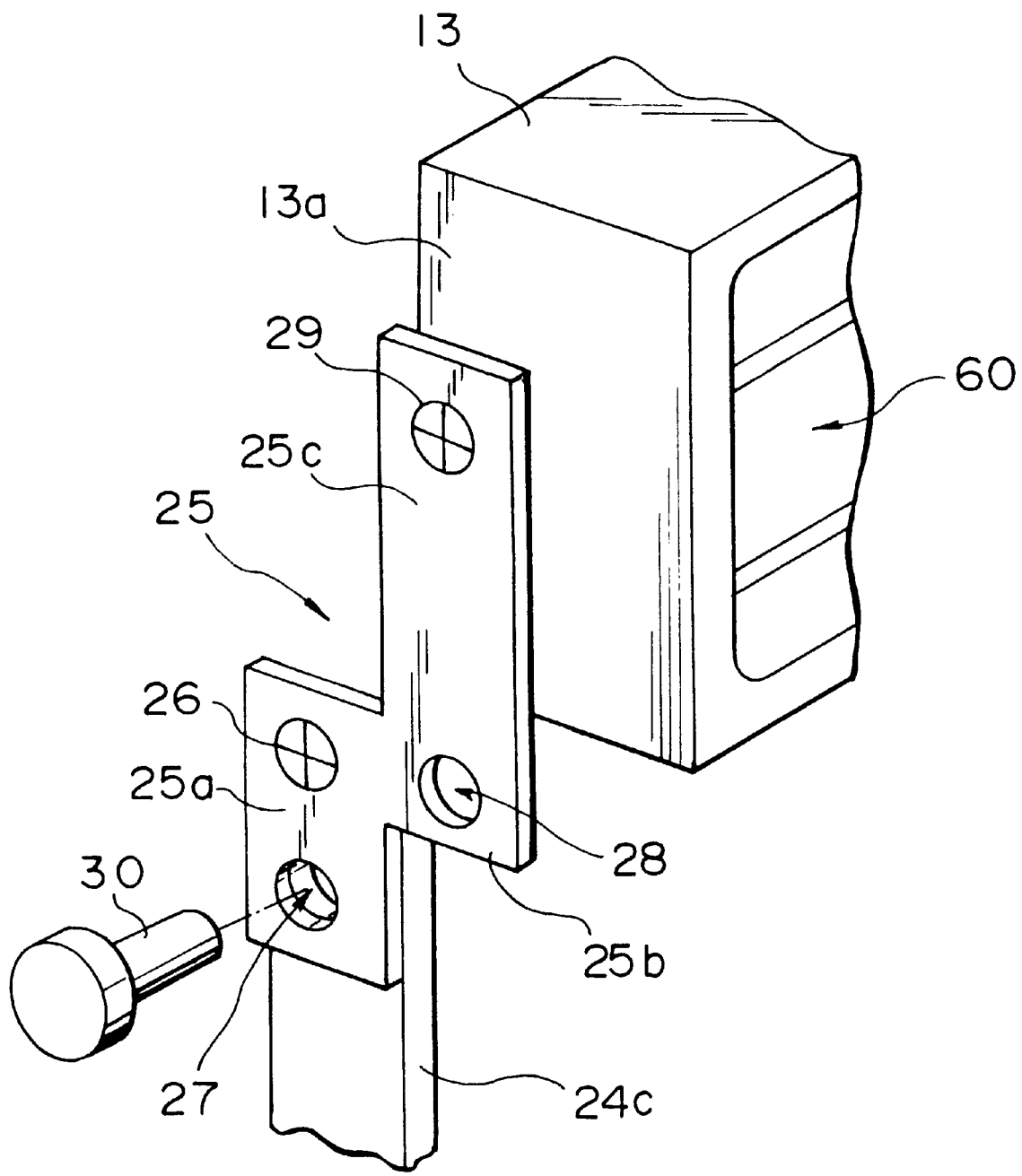

Here, the posture of the lid 13 will be defined. When the lower surface of the lid 13 lies in a horizontal plane as shown in FIGS. 2 and 3, the lid 13 is disposed in a horizontal condition. When the lower surface of the lid 13 lies in a vertical plane as shown in FIG. 5, the lid 13 is disposed in a vertical condition.

When the lower surface of the lid 13 is held in close contact with the base 12, the lid 13 is disposed in a lowered position or condition. When the lower surface of the lid 13 is spaced apart from the base 12, so that a space is formed between the lid 13 and the base 12, the lid 13 is disposed in a raised position or condition.

For example, when the lid 13 is disposed in the horizontal condition and also in the lowered condition, this condition will be referred to as "horizontal lowered condition".

The lid 13 is supported by a support mechanism (described below) so that the lid 13 can be disposed in any one of three conditions, that is, the horizontal lowered condition, the horizontal raised condition, and the vertical raised condition. FIG. 2 shows the lid 13 in its horizontal lowered condition, and FIG. 3 shows the lid 13 in its horizontal raised condition.

In FIG. 2, a frame 20 includes a horizontal portion 20a fixedly mounted on the base mount 8, and a, pair of upstanding portions 20b and 20c extending vertically upwardly from opposite ends of the horizontal portion 20a, respectively.

A pair of guides 21 and 22 each having an L-shaped transverse cross-section are formed respectively on upper end portions of the upstanding portions 20b and 20c, distal ends of the guides 21 and 22 being directed outwardly, that is, away from each other.

A cylinder 23, constituting the engagement and disengagement mechanism, is fixedly mounted on a central portion of the horizontal portion 20a in such a manner that a rod 23a of the cylinder 23 is directed upwardly. An upper end of the rod 23a is connected to a central portion of a horizontal portion 24a of a U-shaped arm 24.

Upstanding portions 24b and 24c, which extend upwardly respectively from opposite ends of the horizontal portion 24a of the U-shaped arm 24, are slidably engaged respectively with the guides 21 and 22 for upward and downward sliding movement. Shafts 26 are mounted on upper end portions of the upstanding portions 24b and 24c, respectively, and brackets 25 are pivotally supported respectively by these shafts 26 so as to be pivotally moved into a vertical condition.

Figure 4:
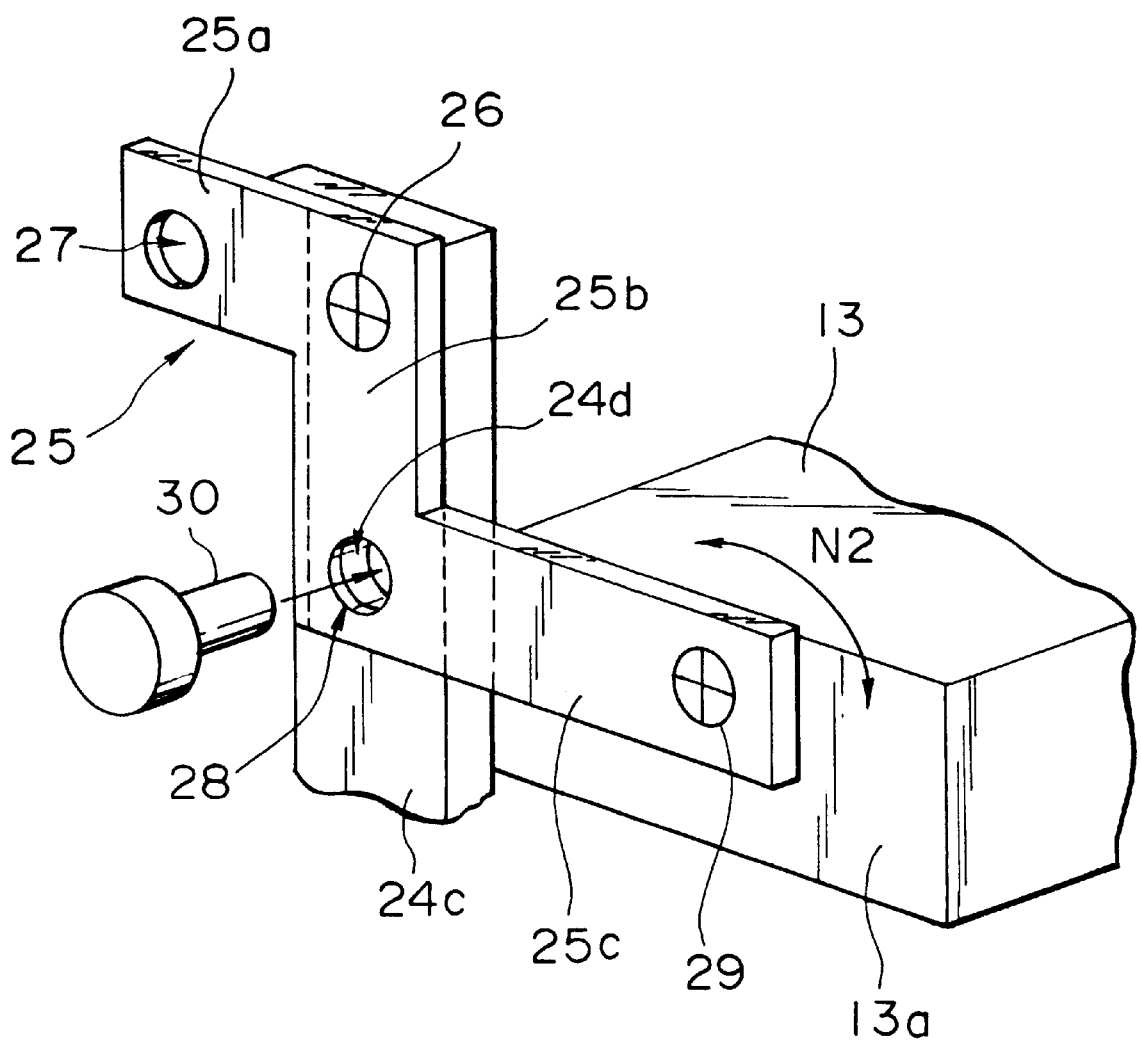
FIGS. 4 and 5 are perspective views showing a bracket in the embodiment of the present invention.

As shown on an enlarged scale in FIG. 4, the bracket 25 is perpendicularly bent at two portions to assume a generally Z-shape. The bracket 25 has a first piece portion 25a, and a second piece portion 25b extending right-angularly from the first piece portion 25a, the first and second piece portions 25a and 25b having the same length. That portion of the bracket 25, at which the centerlines of the first and second piece portions 25a and 25b intersect each other, is pivotally supported on the U-shaped arm 24.

The bracket 25 further has a third piece portion 25c which is longer than the second piece portion 25b, and extends right-angularly from that side of the second piece portion 25b directed away from the first piece portion 25a.

A first pin hole 27 and a second pin hole 28 are formed respectively through the first and second piece portions 25a and 25b in the direction of the thickness thereof, and are equidistant from the axis of the shaft 26.

A shaft 29 is mounted on a distal end portion of the third piece portion 25c of each bracket 25, and supports a side surface 13a of the lid 13 so that the lid 13 can be pivotally moved about the shafts 29 in directions indicated by an arrow N2.

As shown in FIG. 4, an insertion hole 24d is formed through each of the upstanding portions 24b and 24c of the U-shaped arm 24. When the third piece portion 25c is disposed horizontally, the insertion hole 24d is aligned with the second pin hole 28, and when the third piece portion 25c is disposed vertically, the insertion hole 24d is aligned with the first pin hole 27.

Therefore, each second pin hole 28 is aligned with the associated FIG. 4,on hole 24d as shown in FIG. 4, and a pin 30 is passed through these aligned holes 28 and 24d, and by doing so, the third piece portion 25c is held in the horizontal condition, thereby preventing the bracket 25 from rotation, so that the lid 13, mounted on the brackets 25, is also held in the horizontal condition.

On the other hand, when each third piece portion 25c is disposed in the vertical condition, the first pin hole 27, formed through the first piece portion 25a, is aligned with the insertion hole 24d, as shown in FIG. 5.

In this condition, the pin 30 is passed through the aligned first pin hole 27 and insertion hole 24d, so that each third piece portion 25c, as well as the lid 13, is held in the vertical, upstanding condition.

When the lid 13 is brought into the vertical condition, the recess 60, formed in the lower side of the lid 13, is exposed in a horizontal direction. Therefore, those parts mounted within the lid 13, can be easily exchanged or cleaned. When the lid 13 is disposed in the upstanding condition, a large space is available above the base 12, and therefore similar maintenance can be applied to the base 12 and parts mounted on the base 12.

Thus, in the surface treatment apparatus of this embodiment, the lid 13 can be moved into the vertical condition, so that a large space is provided between the lid 13 and the base 12, and therefore the maintenance can be quite easily effected.

Next, the movement of the lid 13 from its horizontal lowered condition to its horizontal raised condition will now be described with reference to FIGS. 2 and 3.

When the lid 13 is in the horizontal lowered condition as shown in FIG. 2, the rod 23a is in a retracted condition, and each pin 30 is passed through the second pin hole 28 and the insertion hole 24d, and the lid 13 is held in the horizontal condition, and the lower surface of the lid 13 is held in close contact with the base 12.

In the horizontal lowered condition of the lid 13, the sealed space is formed by the lid 13 and the base 12, and when the surface treatment is to be Affected in this sealed space, this sealed space is kept to a pressure lower than the atmospheric pressure. Therefore, even if the lid 13 is not pressed against the base 12 with an extremely high force applied by the cylinder 23, the lid 13 can be sufficiently held in close contact with the base 12.

For moving the lid 13 into the horizontal raised condition, the cylinder 23 is operated to extend the rod 23a. As a result, the U-shaped arm 24 moves upward while being guided by the guides 21 and 22, and in accordance with this upward movement, the brackets 25 move upward, with their third piece portions 25c held in the horizontal condition. As a result, the lid 13 moves upward away from the base 12 while kept horizontally.

Therefore, a space is formed between the lid 13 and the base 12 as shown in FIG. 3, so that the first and second arms 15 and 16, which feed the board 6, can pass through this space as indicated by an arrow N1.

Figure 6:
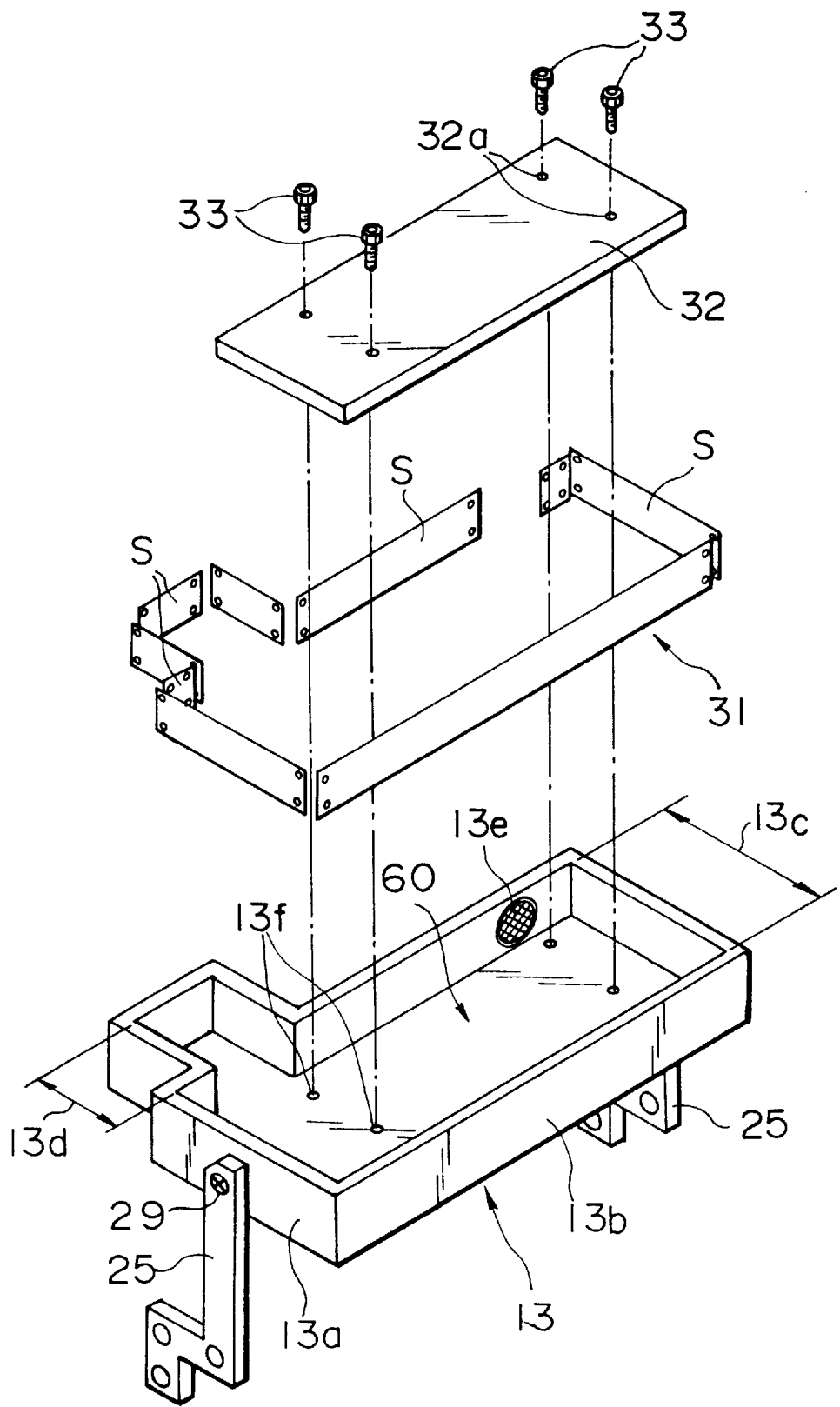
FIG. 6 is an exploded, perspective view of a lid in the embodiment of the present invention, as seen from a bottom side thereof.

The construction of the lid 13 will be described in detail with reference to FIGS. 6 and 7. FIG. 6 is a perspective view of the lid of the invention as viewed from the bottom side thereof.

The lid 13 comprises a lid body 13b of a generally rectangular shape which forms a recess 60 inside. The lid body 13b has a first recess 13c, and a second recess 13d which is smaller in size than the first recess 13c, and extends from one side of the first recess 13c. The first recess 13c can completely contain the board 6 therein, and in this first recess 13c, the plasma cleaning (surface treatment) is applied to the board 6. The first recess 13c will be hereinafter referred to as "treatment chamber", and the second recess 13d will be hereinafter referred to as "exhaust chamber".

A window 13e is provided for observing the interior of the treatment chamber 13c from the exterior, and four screw holes 13f are formed through an upper wall of the treatment chamber 13c.

A plurality of inner covers 31 are secured to an inner surface of a peripheral wall of the lid body 13b defining the treatment chamber 13c and the exhaust chamber 13d. Inner surfaces S of the inner covers 31, facing the treatment chamber 13c and the exhaust chamber 13d, are roughened, that is, have a number of fine pits and projections, and therefore the surface area of each inner cover 31 is increased.

During the time when the board 6 is subjected to the plasma cleaning in the treatment chamber 13c, particulate matters, cut from the board 6, is scattered. This particulate matter is liable to deposit on the roughened surfaces S, thereby preventing the particulate matter, cut from the board 6, from again depositing on the board 6. The inner covers 31 are removably secured to the inner peripheral surfaces of the recess 60 by screws or the like (not shown).

An upper electrode 32 for producing plasma is fixedly secured to the upper wall of the treatment chamber 13c by screws 33 threaded through respective screw holes 32a into the respective screw holes 13f. The upper electrode 32 is electrically grounded.

Figure 8:
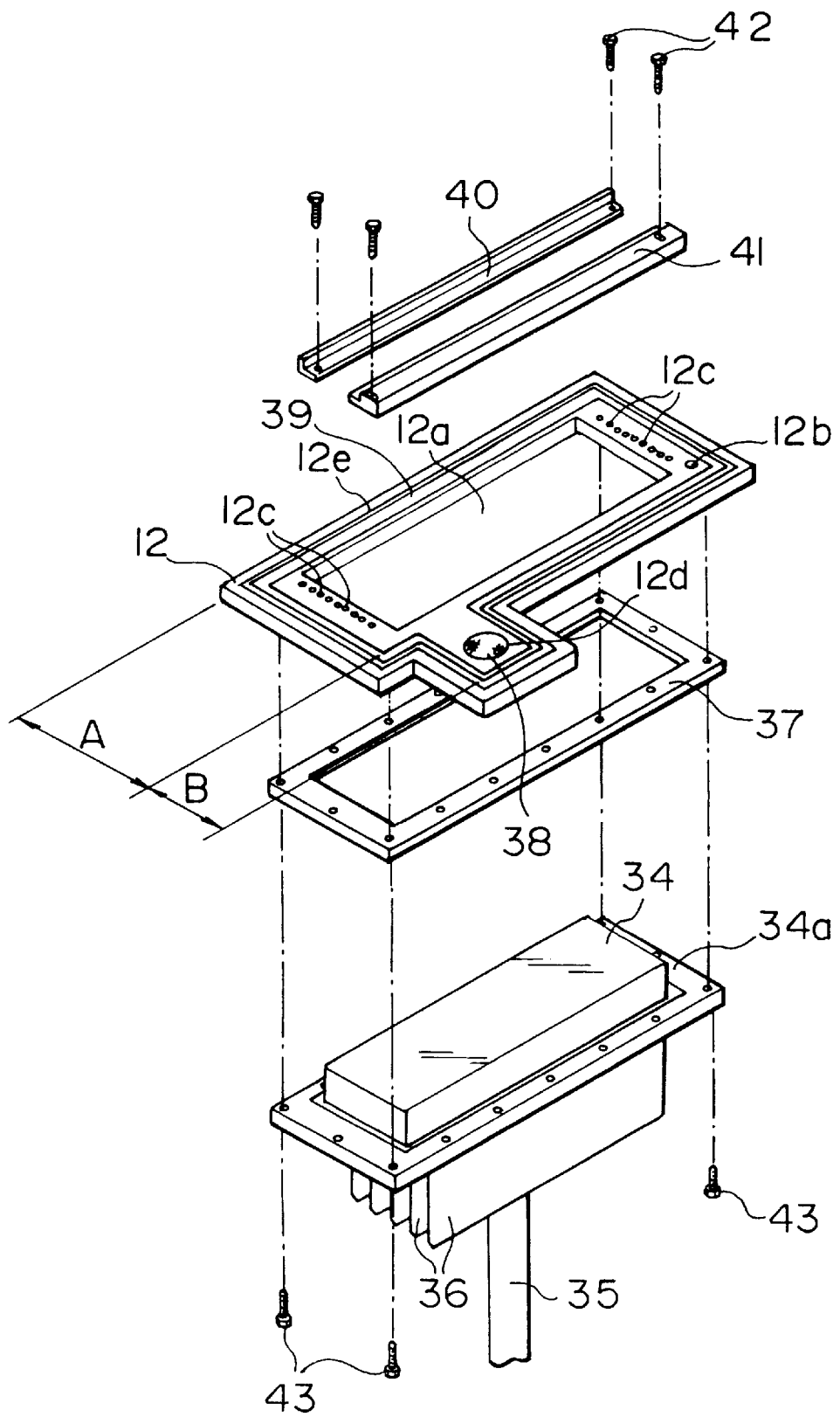
FIG. 8 is an exploded, perspective view of a base in the embodiment of the present invention.
Figure 9:
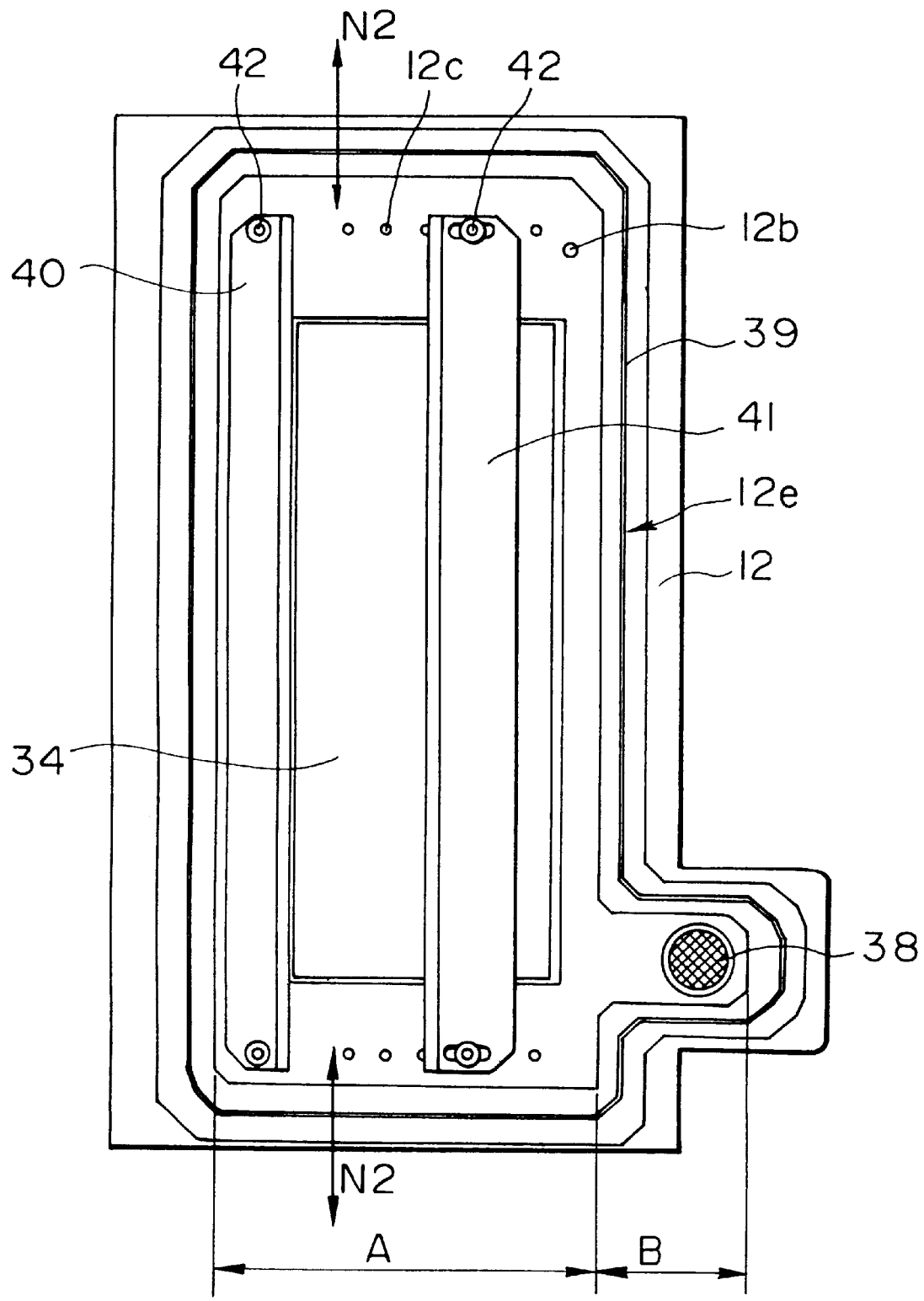
FIG. 9 is a plan view of the base in the embodiment of the present invention.

Next, the base 12 and members associated therewith will now be described with reference to FIG. 8 and 9. FIGS. 8 is an exploded perspective view of the base of the present invention.

Figure 7:
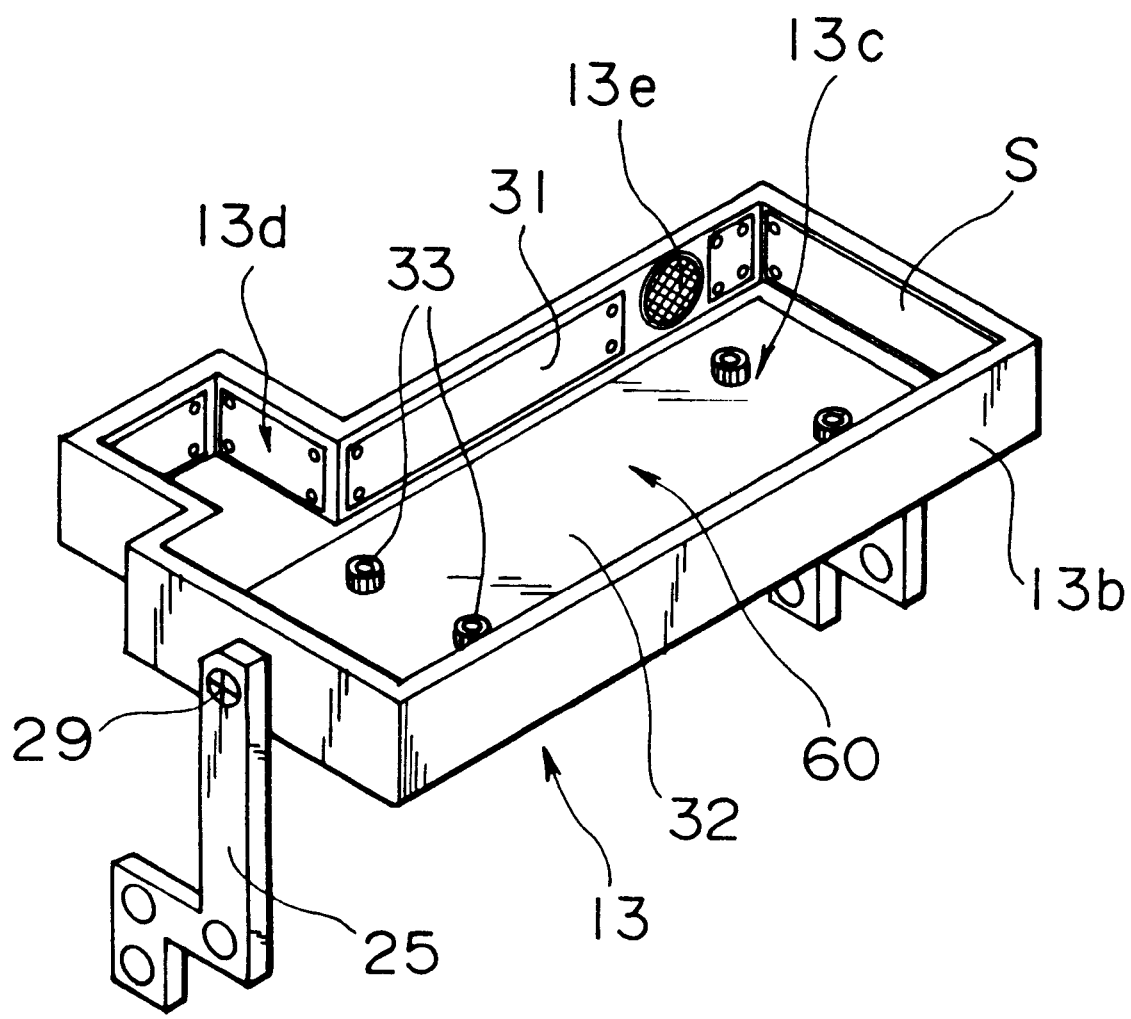
FIG. 7 is a perspective view of the lid as seen from the bottom side thereof.

As shown in FIG. 8, the base 12 comprises a thick plate slightly larger in size than the lid 13 shown in FIG. 7. An opening 12a of a rectangular shape is formed in a central portion of the base 12, and a lower electrode 34 to which high-frequency voltage is applied is fitted in the opening 12a. A cable 35 electrically connects a high-frequency power source to the lower electrode 34.

That portion of the base 12 facing the treatment chamber 13c of the lid 13 is a treatment area A where the plasma cleaning is applied to the board 6. That portion of the base 12, which is adjacent to the treatment area A, and faces the exhaust chamber 13d, is an exhaust area B.

A groove 12e is formed in a marginal portion of the base 12 with which the lower peripheral edge of the lid 13 is adapted to be contacted. An O-ring 39 serving as a seal member is fitted in the groove 12e, and is disposed centrally of the width of the groove 12e. When the lid 13 is in close contact with the O-ring 39, a sealed space K (see FIG. 11) is formed on the base 12 by the treatment chamber 13c and the exhaust chamber 13d.

Figure 11:
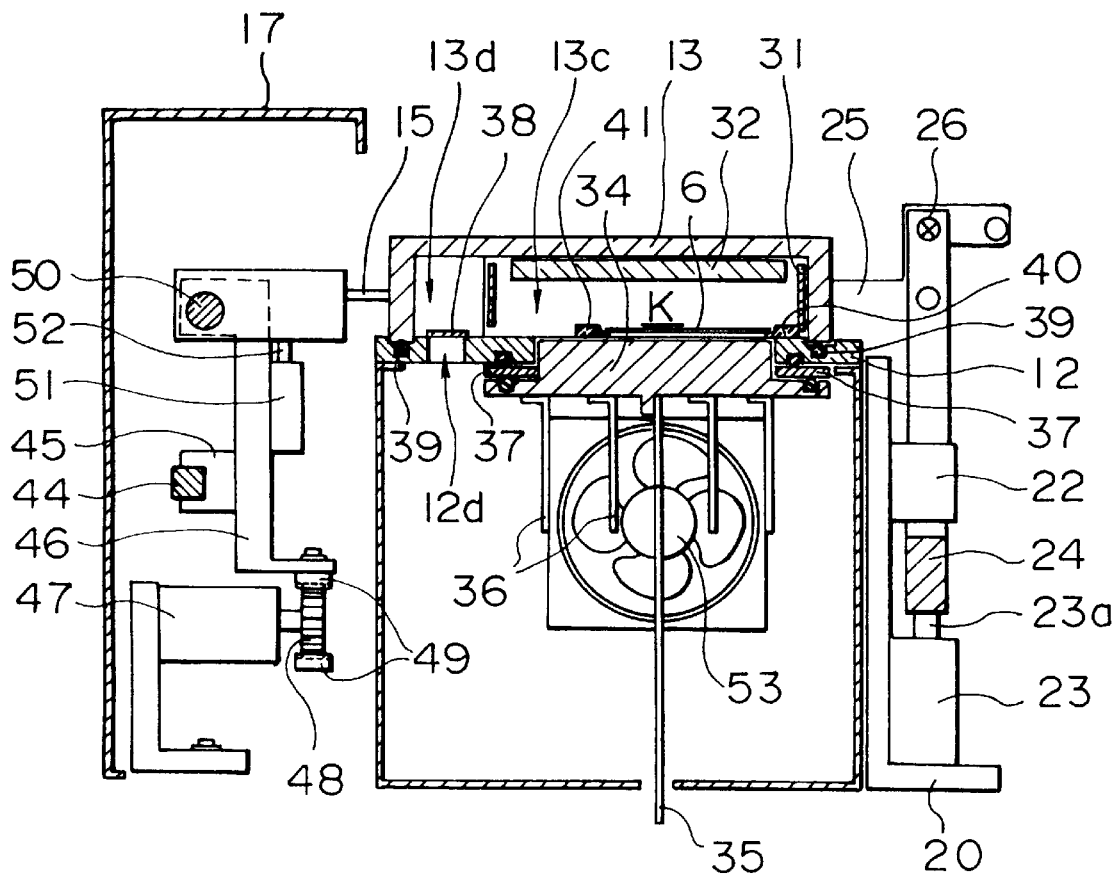

The upper surface of the O-ring 39 is disposed at a level slightly lower than the upper surface of the base 12, as shown in FIG. 11.

With this arrangement, when the board 6 moves over the base 12 in direction of arrow N2 (FIG. 9), the board 6, the first arm 15 and the second arm 16 can smoothly move without contact with the O-ring 39. Thus, the board 6 and the first and second arms 15 and 16 can move without contact with the O-ring 39. The O-ring 39 therefore is prevented from being damaged, and the airtightness in the sealed space K can be kept to a high level, thereby preventing the degree of vacuum from being lowered.

In FIG. 8, a gas supply port 12b for supplying argon gas (operating gas) from a gas bomb (described later) into the treatment area A (that is, the treatment chamber 13c) is formed in a corner portion of the treatment area A.

A series of screw holes 12c are formed in each end of the treatment area A of the base 12, and are arranged in a direction perpendicular to the transfer path L. Those corresponding to the width of the board 6 are selected from each series of screw holes 12c, and guides 40 and 41 for guiding the board 6 are fixedly secured to the base 12 by screws 42 threaded respectively into the selected screw holes 12c. The guides 40 and 41 cooperate with the guides 18, disposed in front of the wire bonding mechanism 14, to form the single transfer path L. When the boards 6, having a different width, are to be used, the corresponding screw holes 12c are selected. Each of the guides 40 and 41 is made of an electrically-insulating material such as a ceramic.

A suction port 12d is formed in the central portion of the exhaust area B of the base 12, and the air within the treatment chamber 13c and the exhaust chamber 13d is discharged through the suction port 12d so as to reduce the pressure within the sealed space K. The air is also introduced into the treatment chamber 13c and the exhaust chamber 13d through the suction port 12d so as to bring the sealed space K into the atmospheric pressure. The suction port 12d is covered with a metal net 38 electrically grounded. When particles, electrically charged upon generation of plasma, pass through the suction port 12d, the electric charge is removed from these particles by the metal net 38.

Cooling fins 36 are thermally connected to the lower surface of the lower electrode 34, and heat, generated during etching, is radiated to the exterior.

In a conventional surface treatment apparatus, a member, corresponding to the lower electrode 34, is mounted within a pressure-reduced space, and it has been difficult to radiate the heat of this member to the exterior, and therefore this member has been cooled by a water-cooled method.

In such a conventional arrangement, pipes for circulating the operating water, a pump for feeding the water, a heat exchanger and so on have been required, and therefore the overall size of the apparatus has been increased. In the present embodiment, however, the lower portion of the lower electrode 34 is open to the exterior, and the cooling can be effected by the air-cooled method using the cooling fins 36, and therefore the cooling can be carried out efficiently in a compact manner.

In FIG. 8, the lower electrode 34 has a peripheral flange 34a formed at the lower portion thereof. An insulating plate 37, having the same shape as that of the flange 34a, is interposed between the lower surface of the base 12 and the flange 34a, and the base 12 and the flange 34a are fastened together by bolts 43. The base 12 and the lower electrode 34 are electrically insulated from each other by the insulating plate 37.

Figure 10:
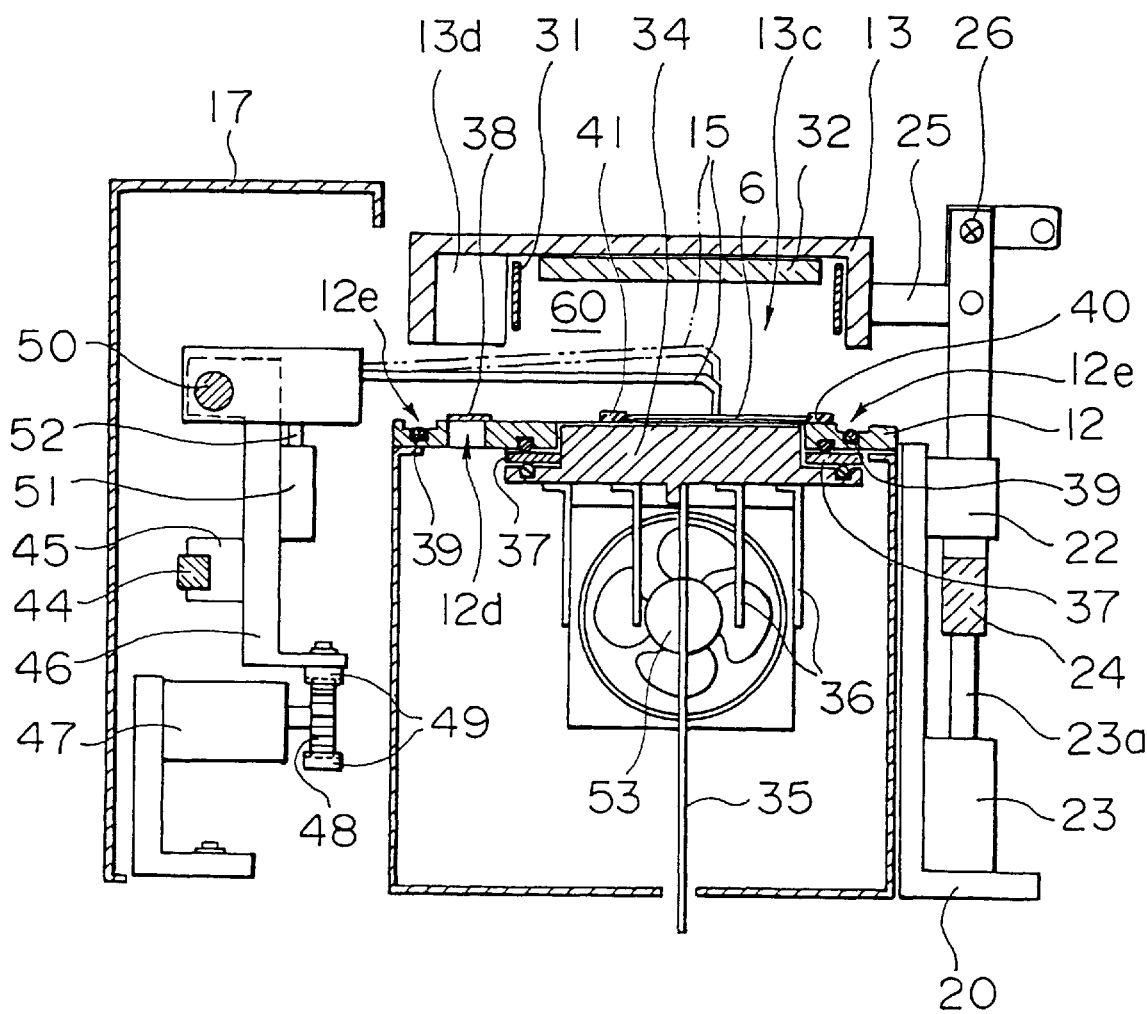
FIGS. 10 and 11 are cross-sectional views of an embodiment of a surface treatment apparatus of the present invention.

FIG. 10 is a cross-sectional view of one embodiment of the surface treatment apparatus of the invention. In FIG. 10, the lid 13 is held in the horizontal raised condition, with a space formed between the lid 13 and the base 12, and the board 6 is fed by the first arm 15.

The moving mechanism for moving the first arm 15 and the second arm 16 will be described with reference to FIG. 10.

An elongated, linear guide 44 is provided within the cover 17 shown in FIGS. 1, and extends parallel to the transfer path L. A slider 45, fixedly mounted on a movable frame 46, is slidably engaged with the linear guide 44, and the movable frame 46 is movable parallel to the transfer path L (that is, in a direction perpendicular to the sheet of FIG. 10).

A lower end of the movable frame 46 is fixedly secured to a timing belt 49 extending parallel to the transfer path L, and a driving force of a motor 47 is transmitted to the timing belt 49 through a pulley 48.

A shaft 50 is mounted on an upper end portion of the moving frame 46, and the first arm 15 is pivotally supported at its proximal end by this shaft 50, the first arm 15 having a hook-shaped distal end portion directed downwardly. A cylinder 51 is fixedly mounted on the moving frame 46, and a rod 52 of this cylinder 51 is connected to the proximal end portion of the first arm 15.

Therefore, by driving the motor 47, the first arm 15 can be reciprocally moved parallel to the transfer path L, and when the cylinder 51 is driven to extend and retract the rod 52, the first arm 15 is moved between an inoperative position (indicated in a dot-and-dash line in FIG. 10) where the first arm 15 is out of engagement with the board 6 and an operative position (indicated by a solid line) where the first arm 15 is engaged with the end of the board 6.

When the motor 47 is driven, with the first arm 15 engaged with the board 6, the board 6 is fed or moved along the transfer path L. The second arm 16 is also fixedly secured to the timing belt 49 as described above for the first arm 15. Therefore, when the motor 47 is driven, the first arm 15 and the second arm 16 are moved at the same time in the horizontal direction. In this embodiment, although the first arm 15 and the second arm 16 are connected to the common timing belt 49 in such a manner that the two arms 15 and 16 are spaced a predetermined distance from each other, the first arm 15 and the second arm 16 may be moved parallel to the transfer path L independently of each other by respective separate moving mechanisms.

In FIG. 10, a fan 53 feeds the air or wind to the cooling fins 36. In this embodiment, the fan 53 is directed away from the wire bonding mechanism 14 toward the supply magazine 9, and with this arrangement the air, blown from the fan 53, will not affect the wire bonding mechanism 14.

When the lid 13 is moved into the horizontal lowered condition, the lower edge of the lid 13 is brought into close contact with the O-ring 39 in the groove 12e, so that the sealed space K is formed by the treatment chamber 13c and the exhaust chamber 13d, as shown in FIG. 11. In the treatment chamber 13c, the electrically-grounded upper electrode 32 faces the lower electrode 34 adapted to be supplied with high-frequency voltage, and the board 6, supported by the guides 40 and 41, is disposed between the two electrodes 32 and 34. The exhaust chamber 13d communicates with the suction port 12d through the metal net 38.

The electrodes of the surface treatment apparatus of this embodiment, as well as the associated construction, will now be described with reference to FIG. 12.

As described above with reference to FIGS. 6 to 9, in the surface treatment apparatus of this embodiment, the electrically-grounded upper electrode 32 is mounted on the lid 13, and the lower electrode 34 adapted to be supplied with high-frequency voltage is mounted on the base 12 facing the lid 13.

Figure 12:
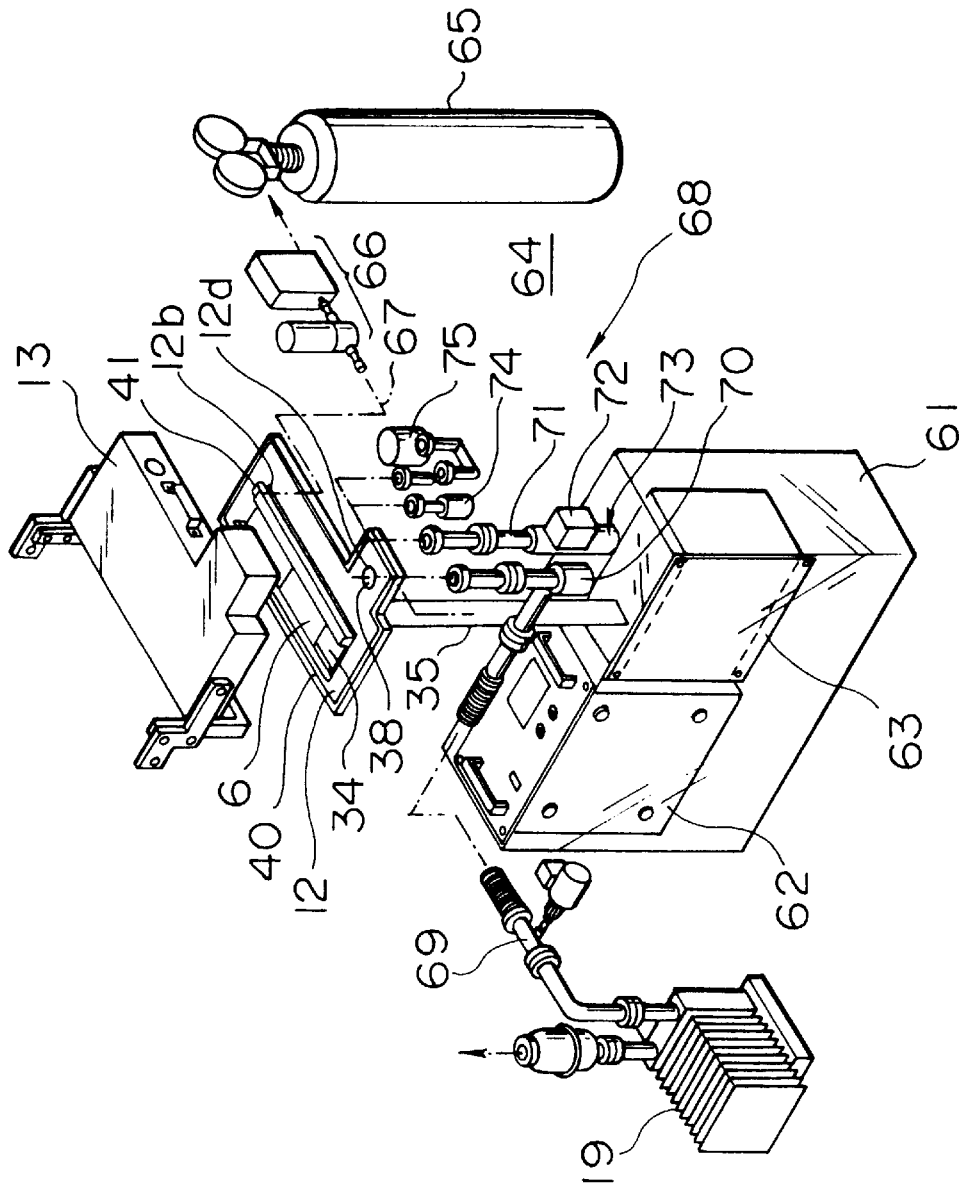
FIG. 12 is a perspective view showing electrodes and associated parts in the embodiment of the present invention.

As shown in FIG. 12, a high-frequency voltage applying portion 61 is connected to the lower electrode 34 via the cable 35. The high-frequency voltage applying portion 61 comprises a high-frequency power source 62 for producing high-frequency voltage, and a tuner 63 for tuning the high-frequency voltage produced by the high-frequency power source 62 and for outputting this voltage to the lower electrode 34 via the cable 35.

Therefore, the board 6 is positioned between the lid 13 and the base 12, and the lid 13 is held in the horizontal lowered position, so that the upper electrode 32 is spaced a predetermined distance from the lower electrode 34, and in this condition, when the high-frequency voltage applying portion 61 is operated, plasma can be produced within the sealed space K.

When the high-frequency voltage applying portion 61 is operated, the lower electrode 34 is heated, and therefore at this time the fan 53 is operated to cool the cooling fins 36 thermally connected to the lower electrode, thereby preventing the lower electrode 34 from rising to an unduly-high temperature.

A gas supply portion 64 for supplying argon gas into the sealed space K via the gas supply port 12b formed in the base 12, as well as a pressure control portion 68 for measuring and controlling the pressure within the sealed space K through the suction port 12d formed in the exhaust area B, will be described with reference to FIGS. 12 and 13.

The gas supply portion 64 comprises a gas bomb 65 for storing argon gas serving as the operating gas, a gas control portion 66 for controlling operating variables such as the flow rate, and pressure of the argon gas discharged from the gas bomb 65, and a discharge pipe 67 connecting the gas control portion 66 to the gas supply port 12b.

When the gas supply portion 64 is operated, the argon gas, being controlled, for example, under flow control, is fed into the sealed space K via the gas supply port 12b. The supply port 12b is provided at that portion of the treatment area A remote from the gas suction port 12d, and the gas suction port 12d is provided at the exhaust area B adjacent to the treatment area A. Therefore, the argon gas never fails to pass through the treatment area A before it reaches the suction port 12d, and therefore the argon gas is sufficiently distributed over the treatment area A, so that variations in concentration of the argon gas can be kept to a low level.

As described more fully later, the argon, discharged to the suction port 12d, is not merely in the form of a gas. When the argon gas is supplied to the treatment area A, the sealed space K is in a pressure-reduced condition close to vacuum, and high-frequency voltage is applied to the lower electrode 34. Therefore, the argon gas is changed into plasma, and effects the etching (plasma cleaning) relative to the board 6. In this embodiment, although the argon gas is used for producing the plasma, any other suitable gas may be used.

The pressure control portion 68 comprises the following four lines or systems.

The first system is a vacuum system. More specifically, a discharge port of a vacuum pump 19 is connected to the suction port 12d via a vacuum pipe 69. A vacuum valve 70 is provided on the vacuum pipe 69 intermediate opposite ends thereof. Therefore, when the vacuum pump 19 is operated, and the vacuum valve 70 is opened, the pressure within the sealed space K is reduced substantially to vacuum.

The second system is an atmosphere-introducing system. More specifically, an atmosphere-introducing pipe 71 is connected to the suction port 12d, and the atmosphere-introducing pipe 71 leads to an atmosphere-introducing port 73 via an atmosphere-introducing valve 72. Therefore, when the atmosphere-introducing valve 72 is opened to introduce the atmosphere or ambient air into the sealed space K, kept at the vacuum created by the vacuum system, via the atmosphere-introducing port 73 and the atmosphere-introducing pipe 71, the sealed space K is restored to the atmospheric pressure.

The third system is a system for a pressure switch 74. When the sealed space K is restored to the atmospheric pressure by the atmosphere-introducing system, the pressure switch 74 determines whether or not the sealed space K has been restored to the atmospheric pressure. The fourth system is a system for a vacuum gauge 75. The vacuum gauge 75 measures the vacuum pressure within the sealed space K when reducing the pressure within the sealed space K by the vacuum system. The provision of the vacuum switch 74 may be omitted.

Figure 13:
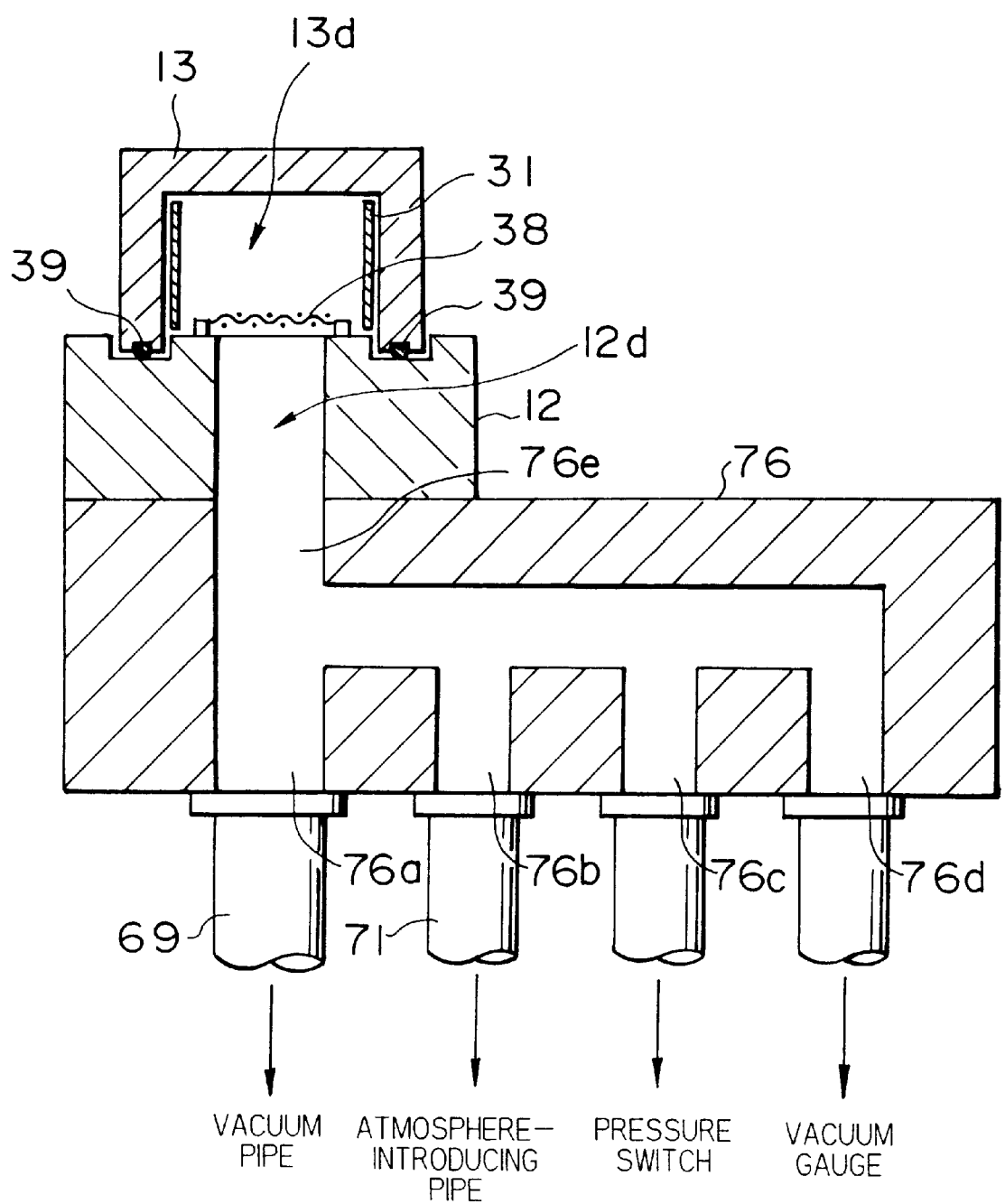
FIG. 13 is a cross-sectional view taken along the line XIII—XIII of FIG. 2.

As shown in FIG. 13 which is a cross-sectional view taken along the line XIII—XIII of FIG.- 2, the above four systems are connected respectively to a first port 76a, a second port 76b, a third port 76c and a fourth port 76d formed in a connection unit 76, the four ports 76a to 76d being open downwardly. In the connection unit 76, the four ports 76a to 76d are connected to a common port .76e which is open upwardly, and the common port 76e is connected directly to the suction port 12d in the base 12.

The following describes the operation in which in the horizontal raised condition of the lid 13, the board 6 is fed into the space between the lid 13 and the base 12, and then the plasma cleaning is applied to this board 6.

First, when the board 6 is fed into the space between the lid 13 and the base 12, the board 6 is supported in the transfer path L by the guides 40 and 41 constituting part of the transfer path L. Since the lid 13 is still in the raised condition, the atmosphere around the board 6 is at the atmospheric pressure.

Then, the cylinder 23 is driven to bring the lower edge of the lid 13 into contact with the O-ring 39 as shown in FIG. 11, thereby forming the sealed space K by the lid 13 and the base 12. Then, the vacuum pump 19 is driven, and the vacuum valve 70 is opened to reduce the pressure within the sealed space K. At this time, the vacuum pressure within the sealed space K is monitored by the vacuum gauge 75.

When the pressure within the sealed space K is sufficiently reduced, the gas supply portion 64 is operated to supply argon gas into the treatment chamber 13c of the sealed space K via the gas supply port 12b. Then, the high-frequency voltage applying portion 61 is operated to apply high-frequency voltage to the lower electrode 34, thereby producing plasma in the treatment chamber 13c. The cleaning is effected by charged particles in this plasma.

At this time, the charged particles can be scattered toward the suction port 12d. However, since the metal net 38, connected to the ground, is provided at the suction port 12d, the electric charge of the charged particles is removed when these charged particles deposit on the metal net 38, and therefore the charged particles will not reach the vacuum system and so on. This condition is maintained for a period of time. This time period is necessary for achieving the sufficient cleaning, and is predetermined.

Upon termination of this time period, the application of the high-frequency voltage is stopped, and the supply of the argon gas from the gas supply portion 64 is stopped. The vacuum valve 70 is closed. Then, the atmosphere-introducing valve 72 is opened to introduce the atmosphere (ambient air) into the sealed space K through the atmosphere-introducing port 73. As a result, the pressure within the sealed space K increases, and at this time it is determined by the pressure switch 74 whether or not the pressure within the sealed space K is returned to the atmospheric pressure.

Then, when the pressure within the sealed space K is restored to the atmospheric pressure, the atmosphere-introducing valve 72 is closed, and the cylinder 23 is driven to move the lid 13 into the horizontal raised condition. Then, the surface treated board 6 is moved out of the space between the lid 13 and the base 12, and then the board 6 to be surface treated is moved into the space between the lid 13 and the base 12.

Figure 14:
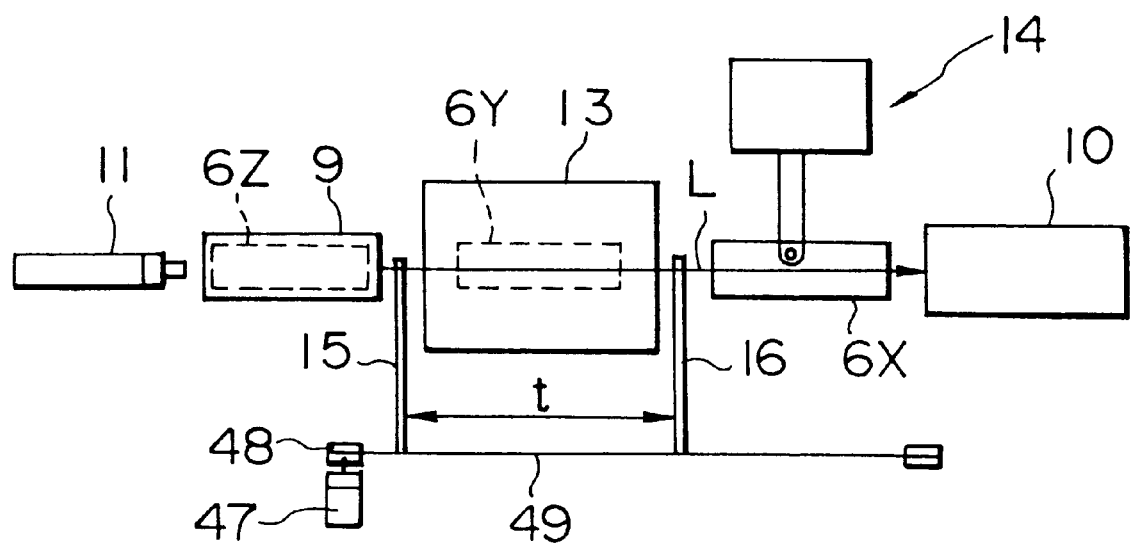
FIG. 14 is a schematic plan view showing a transfer path in the embodiment of the present invention.

Next, the transfer of the board 6 in the surface treatment apparatus of this embodiment will be described with reference to FIGS. 14 and 15. FIG. 14 is a plan view showing the transfer path in the embodiment of the present invention.

As described above, the boards 6 are transferred mainly by the first arm 15 and the second arm 16 which constitute the transfer means. The first and second arms 15 and 16 are fixedly secured to the single timing belt 49, and are spaced the predetermined distance t from each other, and are movable in unison in the direction parallel to the transfer path L.

There are provided the cylinders 51 (see FIG. 10) for respectively moving the first and second arms 15 and 16 upward and downward, and therefore the first and second arms 15 and 16 can be moved upward and downward independently of each other.

In the following description, in the sequence from the downstream side, the first board 6X has been surface treated, and is subjected to the wire bonding by the wire bonding mechanism 14, and the second board 6Y is surface treated in the sealed space K, and the third board 6Z has not yet been surface treated, and is received in the supply magazine 9.

In the positional relation shown in FIG. 14, when the wiring bonding for the first board 6X and the surface treatment for the second board 6Y are finished, the lid 13 is moved into the horizontal raised condition.

Figure 15A:
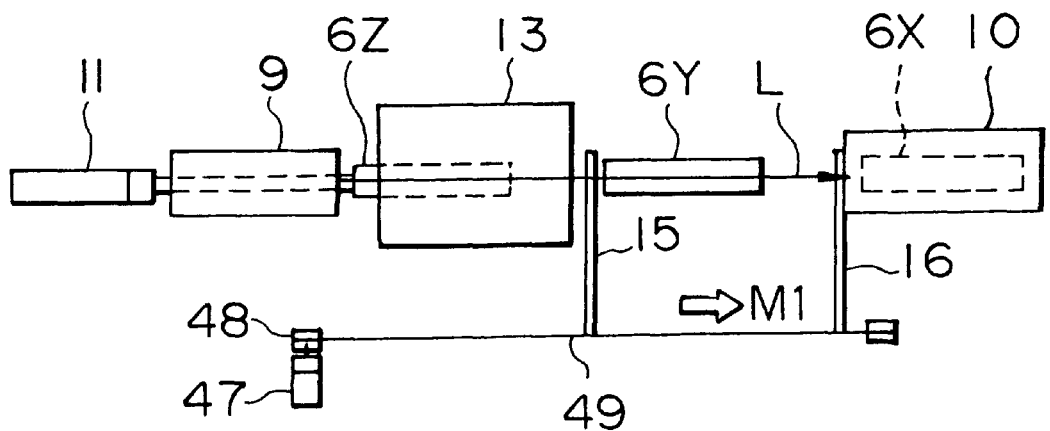
FIGS. 15A to 15C are schematic plan views showing a transfer operation in the embodiment of the present invention.

Then, the second arm 16 is brought into engagement with the first board 6X, and the first arm 15 is brought into engagement with the second board 6Y as shown in FIG. 15A, and the motor 47 is driven to feed the first board 6X into the receiver magazine 10 (in a direction of arrow M1) and also to move the second board 6Y to the position in front of the wire bonding mechanism 14 (in the direction of arrow M1). At the same time, the push cylinder 11 is driven to feed the third board 6Z from the supply magazine 9 toward the space between the lid 13 and the base 12.

Figure 15B:
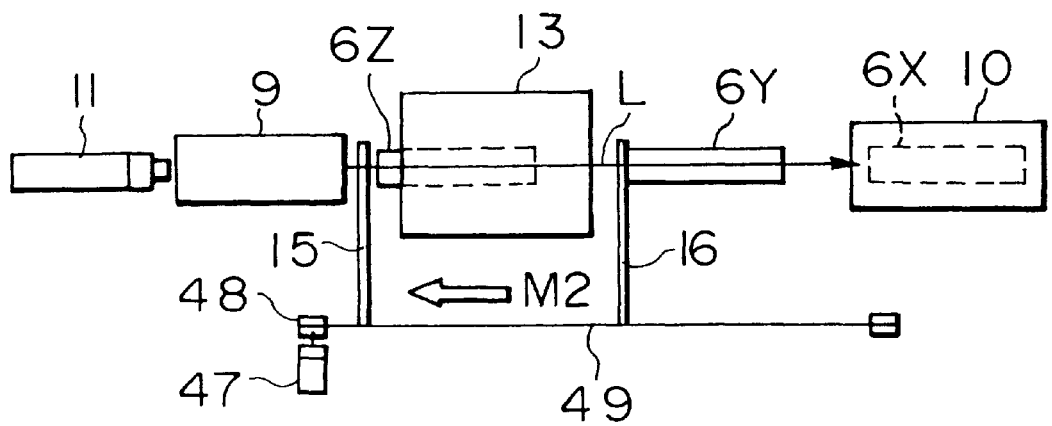
Figure 15C:
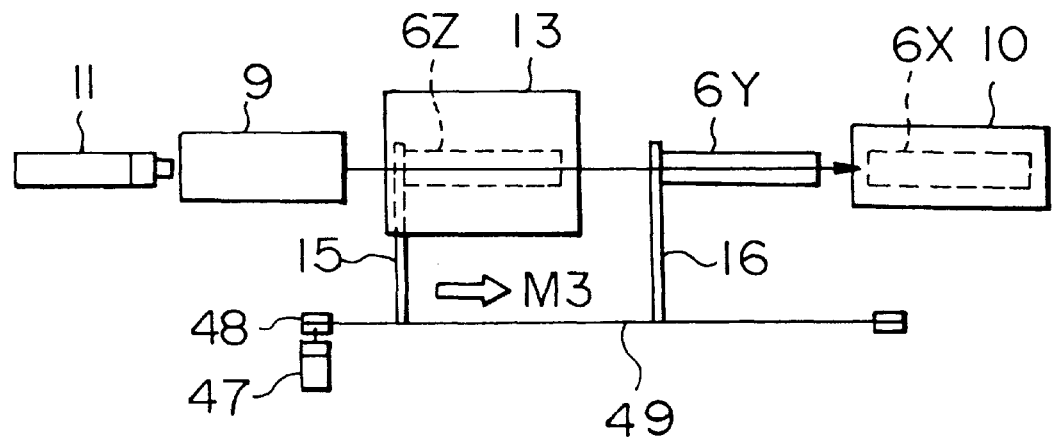

Then, as shown in FIG. 15B, the first arm 15 and the second arm 16 are raised, and the first arm 15 is moved to a position located rearwardly of the rear end of the third board 6Z (in a direction of arrow M2) while the second arm 16 is moved to a position located rearwardly of the rear end of the second board 6Y (in the direction of arrow M2). Then, as shown in FIG. 15C, the first and second arms 15 and 16 are lowered, and are brought into engagement with the third board 6Z and the second board 6Y, respectively, and the third board 6Z is moved by the first arm 15 to the position corresponding to the position of the second board 6Y of FIG. 14 (in a direction of arrow M3) while the second board 6Y is moved by the second arm 16 to the position corresponding to the position of the first board 6X of FIG. 14 (in the direction of the arrow M3).

Then, the first and second arms 15 and 16 are returned to their respective positions shown in FIG. 14, and the lid 13 is moved into the horizontal lowered condition. Then, the surface treatment for the third board 6Z and the wiring bonding for the second board 6Y are carried out in a parallel manner. By repeating the above operation, the boards are sequentially subjected to the wiring bonding immediately after these board are surface treated.

Thus, in the wiring bonding apparatus of this embodiment, the surface treatment apparatus and the wiring bonding mechanism are arranged in line with each other in the transfer path L, and the surface treated board 6 is fed toward the wire bonding mechanism 14 at the downstream side of the transfer path L, and substantially simultaneously therewith, the board 6 to be surface treated is fed into the surface treatment apparatus from the upstream side of the transfer path L. Therefore, the surface treatment, the transfer and the wire bonding of the boards can be successively carried out almost without any time loss, so that the productivity can be greatly enhanced.

What is claimed is:

1. A surface treatment method comprising the steps of:
    (a) transferring an object to a position above a treatment electrode mounted to a center portion of a base in an electrically insulating state;
    (b) placing a lid having a recess for forming a sealed space into close contact with an upper surface of said base so as to form a sealed space for receiving said object on said upper surface;
    (c) reducing the pressure of said sealed space to a pressure less than atmospheric pressure;
    (d) thereafter, introducing plasma-producing gas into said pressure-reduced sealed space;
    (e) applying a high-frequency voltage to said treatment electrode so as to produce plasma, thereby treating a surface of said object;
    (f) thereafter, restoring said sealed space to atmospheric pressure;
    (g) removing said lid from contact with said upper surface of the base; and (h) transferring said object from said position above said treatment electrode.

2. A surface treatment method according to claim 1, wherein said object includes electrodes and said surface treatment is a treatment for etching surfaces of the electrodes of the object.

3. A surface treatment method according to claim 1, wherein a guide for guiding the transfer of said object is provided on said base, and wherein step (h) includes transferring said object along said guide.

4. A surface treatment method according to claim 1, wherein step (a) is performed while said object is exposed to the ambient atmosphere.

5. A surface treatment method according to claim 1, wherein step (b) comprises placing said lid such that said treatment electrode is disposed within said sealed space.

6. A surface treatment method according to claim 1, wherein said lid includes a grounding electrode disposed in said recess.

7. A wire bonding method comprising the steps of:
  (a) transferring an object to a position above a treatment electrode mounted to a center portion of a base in an electrically insulating state;
  (b) placing a lid having a recess for forming a sealed space into close contact with an upper surface of said base so as to form a sealed space for receiving said object on said upper surface;
  (c) reducing the pressure of said sealed space to a pressure less than atmospheric pressure;
  (d) thereafter, introducing plasma-producing gas into said pressure-reduced sealed space;
  (e) applying a high-frequency voltage to said treatment electrode so as to produce plasma, thereby treating a surface of said object;
  (f) thereafter, restoring said sealed space to atmospheric pressure;
  (g) removing said lid from contact with said upper surface of the base;
  (h) transferring said object from said position above said treatment electrode along a transfer path to a position opposite a wire bonding means; and
  (i) bonding wires to electrodes of said object with said wire bonding means.

8. A wire bonding method according to claim 7, wherein said object includes electrodes and said surface treatment is a treatment for etching surfaces of the electrodes of the object.

9. A wire bonding method according to claim 7, wherein said object includes electrodes treated in step (e), and said electrodes comprise a barrier metal layer formed on a surface of a circuit pattern, and a layer of gold formed on a surface of said barrier metal layer, said barrier metal layer containing nickel.

10. A wire bonding method according to claim 9, wherein said gold layer is formed by a substitution electroless plating method.

11. A surface treatment method according to claim 7, wherein a guide for guiding the transfer of said object is provided on said base, and wherein step (h) includes transferring said object along said guide.

12. A surface treatment method according to claim 7, wherein step (a) is performed while said object is exposed to the ambient atmosphere.

13. A surface treatment method according to claim 7, wherein step (b) comprises placing said lid such that said treatment electrode is disposed within said sealed space.

14. A surface treatment method according to claim 7, wherein said lid includes a grounding electrode disposed in said recess.

* * * * *